United States Patent
Kashio

(10) Patent No.: US 8,481,669 B2
(45) Date of Patent: Jul. 9, 2013

(54) MOLDING MATERIAL COMPRISING POLYSILSESQUIOXANE COMPOUND, SEALING MATERIAL, AND SEALED OPTICAL ELEMENT

(75) Inventor: Mikihiro Kashio, Tokyo (JP)

(73) Assignee: Lintec Corporation, Tokyo (JP)

( * ) Notice: Subject to any disclaimer, the term of this patent is extended or adjusted under 35 U.S.C. 154(b) by 181 days.

(21) Appl. No.: 12/213,283

(22) Filed: Jun. 17, 2008

(65) Prior Publication Data
US 2009/0005530 A1 Jan. 1, 2009

(30) Foreign Application Priority Data

Jun. 29, 2007 (JP) ................................ 2007-171478
Mar. 3, 2008 (JP) ................................ 2008-51568

(51) Int. Cl.
*C08G 77/14* (2006.01)
(52) U.S. Cl.
USPC .......................................... 528/41; 428/447
(58) Field of Classification Search
USPC .......................................... 528/41; 428/447
See application file for complete search history.

(56) References Cited

U.S. PATENT DOCUMENTS

2008/0249271 A1* 10/2008 Beppu et al. .................. 526/273

FOREIGN PATENT DOCUMENTS

| JP | 2004-359933 A | | 12/2004 |
| JP | 2005 092099 | * | 4/2005 |
| JP | 2005-263869 A | | 9/2005 |
| JP | 2006-328231 A | | 12/2006 |

OTHER PUBLICATIONS

JP 2005 092099 Machine translation (2005).*

* cited by examiner

*Primary Examiner* — Kuo-Liang Peng
(74) *Attorney, Agent, or Firm* — Birch, Stewart, Kolasch & Birch, LLP

(57) ABSTRACT

A molding material which can produce cured products with long-lasting excellent transparency and heat resistance, a sealing material in which the molding material is used, and a sealed optical element are provided. The molding material comprises a polysilsesquioxane compound with a ladder structure having a repeating unit of the following formula (I) in the molecule as a major component.

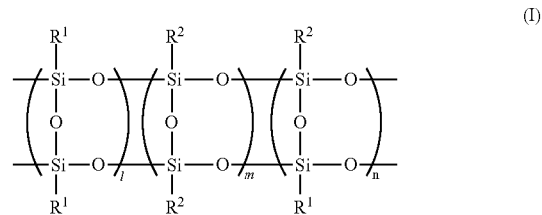

(I)

wherein $R^1$ represents a group shown by the formula AO—$(CH_2)_r$— (wherein A indicates a protective group for a hydroxyl group and r is an integer of 1 to 10), $R^2$ represents a substituted or unsubstituted phenyl group, a substituted or unsubstituted (excluding substitution with OA in the above formula) alkyl group having 1 to 20 carbon atoms, or an alkenyl group having 2 to 20 carbon atoms, and l, m, and n individually represent 0 or an arbitrary integer, provided that l and n are not 0 at the same time.

11 Claims, 4 Drawing Sheets

(A)

(B)

(a)

(b)

(a)

(b)

(c)

(d)

(a)

(b)

(a)

(b)

MOLDING MATERIAL COMPRISING POLYSILSESQUIOXANE COMPOUND, SEALING MATERIAL, AND SEALED OPTICAL ELEMENT

BACKGROUND OF THE INVENTION

1. Field of the Invention

The present invention relates to a molding material which can produce cured products with excellent transparency and heat resistance comprising a polysilsesquioxane compound as a major component, a sealing material in which the molding material is used, and a sealed optical element comprising an optical element sealed by a cured product of the sealing material.

2. Description of Related Art

An optical element includes various lasers such as a laser diode (LD), a light emitting element such as a light emitting diode (LED), a light receiving element, a complex optical element, a photonic integrated circuit, and the like. In recent years, an optical element emitting a blue light or a white light with a short wavelength has been developed and widely used. A rapid increase in brightness of light emitting elements with a short wavelength of luminescence tends to accompany an increase of the calorific power of the optical element.

An optical element is usually used as a sealed optical element in which the optical element is sealed with a cured product of a sealing material.

In general, a composition containing a transparent epoxy resin as a major component which can produce a cured product with excellent heat resistance and the like has been known as the sealing material for optical elements.

However, along with an increase in brightness of optical elements in recent years, the cured products of the optical element sealing material are exposed to a higher energy light and a higher temperature generated by the optical elements which cause deterioration, resulting in cracking and yellowing (coloration) of the cured products. Cracks produced in the cured sealing material make the optical elements unusable. Coloration reduces transparency and lowers the brightness of the optical elements.

In order to solve these problems, sealing materials for optical elements using a polysilsesquioxane compound as a major component have been proposed in Patent Documents 1 to 3. The polysilsesquioxane compounds disclosed in Patent Documents 1 to 3 are claimed to produce a sealed optical element excelling in crack resistance and heat resistance.

However, it is sometimes difficult for the cured sealing materials for the optical elements containing the polysilsesquioxane compounds disclosed in Patent Documents 1 to 3 to sufficiently prevent yellowing when exposed to a high energy light or a high temperature generated by the optical elements. Therefore, development of a sealing material for optical elements which can produce a cured product exhibiting more excellent crack resistance and heat resistance has been desired.

[Patent Document 1] JP-A-2004-359933
[Patent Document 2] JP-A-2005-263869
[Patent Document 3] JP-A-2006-328231

SUMMARY OF THE INVENTION

The present invention has been achieved in view of this situation in general technology and has an object of providing a molding material capable of producing a cured product which is excellent in heat resistance and is free from color deterioration when exposed to high energy light or a high temperature for a long time, a sealing material in which the molding material is used, and a sealed optical element comprising an optical element sealed by the cured product of such a sealing material.

As a result of extensive studies in order to achieve the above object, the inventors of the present invention have found that a cured product of a molding material containing a polysilsesquioxane compound with a ladder structure having a repeating unit shown by the following formula (I) as a major component exhibits outstanding transparency and heat resistance over a long period of time. This finding has led to the completion of the present invention.

Specifically, according to a first aspect of the present invention, the following molding materials (1) to (5) are provided.
(1) A molding material comprising a polysilsesquioxane compound with a ladder structure having a repeating unit of the following formula (I) in the molecule,

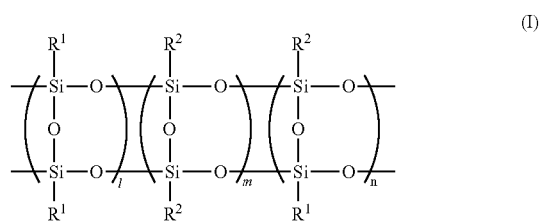

wherein $R^1$ represents a group shown by the formula AO—$(CH_2)_r$— (wherein A indicates a protective group for a hydroxyl group and r is an integer of 1 to 10), $R^2$ represents a substituted or unsubstituted phenyl group, a substituted or unsubstituted (excluding substitution with OA in the above formula) alkyl group having 1 to 20 carbon atoms, or an alkenyl group having 2 to 20 carbon atoms, and l, m, and n individually represent 0 or an arbitrary integer, provided that l and n are not 0 at the same time.
(2) The molding material according to (1), wherein the polysilsesquioxane compound is obtained by condensing a silane compound (1) shown by the formula (1), $R^1Si(OR^3)_p(X^1)_{3-p}$ (wherein $R^1$ has the same meaning as above, $R^3$ represents an alkyl group having 1 to 6 carbon atoms, $X^1$ indicates a halogen atom, and p is an integer from 0 to 3), and a silane compound (2) shown by the formula (2), $R^2Si(OR^4)_q(X^2)_{3-q}$ (wherein $R^2$ has the same meaning as above, $R^4$ represents an alkyl group having 1 to 6 carbon atoms, $X^2$ indicates a halogen atom, and q is an integer from 0 to 3), at a molar ratio of silane compound (1):silane compound (2) is 10:90 to 100:0.
(3) The molding material according to (1) or (2), wherein $R^1$ in the formula (I) represents a formula $R^5C(=O)$—O—$(CH_2)_3$—, wherein $R^5$ represents an alkyl group having 1 to 6 carbon atoms or a substituted or unsubstituted phenyl group.
(4) The molding material according to any one of (1) or (3), wherein the polysilsesquioxane compound is a compound having a weight average molecular weight of 1,000 to 10,000.
(5) The molding material according to any one of (1) to (4), which does not contain a curing agent.

According to a second aspect of the present invention, a sealing material described in (6) and (7) below are provided.
(6) A sealing material in which the molding material according to any one of (1) to (5) is used.
(7) The sealing material according to (6), which is an optical element sealing material.

According to a third aspect of the present invention, a sealed optical element described in (8) below is provided.

(8) A sealed optical element in which an optical element is sealed with a cured product of the sealing material according to (7).

A cured product exhibiting excellent transparency and heat resistance for a long period of time without reducing transparency due to coloration by high energy light and heat emitted by an optical element which emits luminescence with a short wavelength and high brightness can be obtained using the molding material of the present invention.

Since the sealed optical element of the present invention is sealed with the molding material of the present invention, the sealed optical element excels in heat resistance and exhibits only small color deterioration when used for a long period of time.

BRIEF DESCRIPTION OF THE DRAWINGS

The present invention will become more fully understood from the detailed description given hereinbelow and the accompanying drawings. The drawings are not to scale, and are given by way of illustration only. Accordingly, the drawings should not be construed as limiting the present invention.

FIG. 1(A) shows a lamp-shaped scaled LED. FIG. 1(B) shows an SMD (Surface Mount Device)-type sealed LED.

DETAILED DESCRIPTION OF THE INVENTION AND PREFERRED EMBODIMENTS

Figure 1:
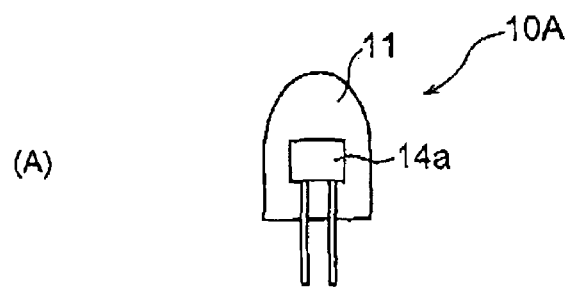
FIG. 1 shows preferred embodiments of the sealed optical element of the present invention.
Figure 1:
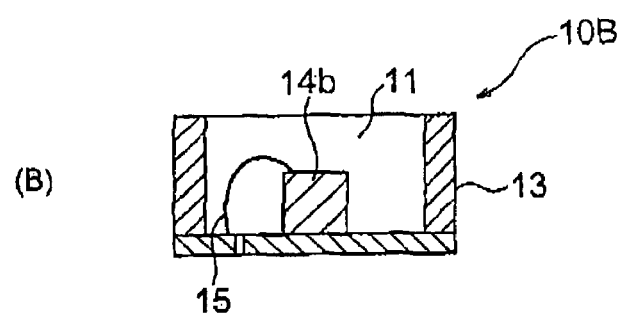

The present invention will be described in detail below.

1) Molding Material

The molding material of the present invention is characterized by comprising a polysilsesquioxane compound with a ladder structure having a repeating unit of the above formula (I) in the molecule (hereinafter referred to from time to time as "polysilsesquioxane compound (I)") as a major component.

In the molding material of the present invention, the term "comprising the polysilsesquioxane compound (I) as a major component" means that the sealing material for optical elements contains one or more polysilsesquioxane compounds (I) and may further contain other additive components described later, to the extent that the object of the present invention is not inhibited. The amount of the polysilsesquioxane compound (I) in the molding material of the present invention is usually 70 wt % or more, preferably 80 wt % or more, and more preferably 90 wt % or more of the total amount of the molding material.

In the above formula (I), $R^1$ represents a group shown by the formula AO—$(CH_2)_r$—.

A represents a protective group for a hydroxyl group. As the protective group for a hydroxyl group, the general protective groups which are known as the protective group for a hydroxyl group can be used without particular limitation. For example, an acyl protective group such as an acetyl group, a propionyl group, and a benzoyl group; a silyl protective group such as a trimethylsilyl group, a triethylsilyl group, a tert-butyldimethylsilyl group, and a t-butyldiphenylsilyl group; an acetal protective group such as a methoxymethyl group, a methoxyethoxymethyl group, a 1-ethoxyethyl group, a tetrahydropyran-2-yl group, and a tetrahydrofuran-2-yl group; an alkoxycarbonyl protective group such as a tert-butoxycarbonyl group; an ether protective group such as a methyl group, an ethyl group, a t-butyl group, an octyl group, an allyl group, a triphenylmethyl group, a benzyl group, p-methoxybenzyl group, a fluorenyl group, a trityl group, and a benzhydryl group; and the like can be given.

Of these, an acyl protective group, particularly an acetyl group, is preferable since a molding material exhibiting excellent heat resistance and small coloration for a long time can be obtained.

r represents an integer of 1 to 10, preferably 1 to 3, and particularly preferably 3.

Of these, as $R^1$, a group shown by the formula $R^5C(=O)$—O—$(CH_2)_3$— is preferable. In the formula, $R^5$ represents an alkyl group having 1 to 6 carbon atoms such as a methyl group, an ethyl group, an n-propyl group, an isopropyl group, an n-butyl group, an isobutyl group, a sec-butyl group, a t-butyl group, and an n-pentyl group; or a substituted or unsubstituted phenyl group. As the substituent in the substituted or unsubstituted phenyl group, an alkyl group such as a methyl group, an ethyl group, an n-propyl group, an isopropyl group, an n-butyl group, a sec-butyl group, an isobutyl group, a t-butyl group, an n-pentyl group, an n-hexyl group, an n-heptyl group, an n-octyl group, and an iso-octyl group; a halogen atom such as a fluorine atom, a chlorine atom, and a bromine atom; and an alkoxy group such as a methoxy group and an ethoxy group can be given. As $R^1$, a 3-acetoxypropyl group shown by the formula $CH_3C(=O)$—O—$(CH_2)_3$—, particularly a group in which $R^5$ in the above formula is a methyl group, is preferable.

$R^2$ represents a substituted or unsubstituted phenyl group, a substituted or unsubstituted alkyl group having 1 to 20 carbon atoms (excluding the group shown by OA in the above formula), or an alkenyl group having 2 to 20 carbon atoms.

As examples of the substituent for the phenyl group which may have a substituent, alkyl groups such as a methyl group, an ethyl group, an n-propyl group, an isopropyl group, an n-butyl group, a sec-butyl group, an isobutyl group, a t-butyl group, an n-pentyl group, an n-hexyl group, an n-heptyl group, an n-octyl group, and an isooctyl group; halogen atoms such as a fluorine atom, a chlorine atom, and a bromine atom; and alkoxy groups such as a methoxy group and an ethoxy group can be given.

Specific examples of the phenyl group which may have a substituent include a phenyl group, a 4-methylphenyl group, a 4-chlorophenyl group, and a 4-chloromethylphenyl group.

Examples of the alkyl groups having 1 to 20 carbon atoms (excluding the group shown by OA in the above formula) are a methyl group, an ethyl group, an n-propyl group, an isopropyl group, an n-butyl group, a sec-butyl group, an isobutyl group, a t-butyl group, an n-pentyl group, an n-hexyl group, an n-heptyl group, an n-octyl group, an isooctyl group, an n-nonyl group, an n-decyl group, and an n-dodecyl group.

As examples of the substituents for the alkyl group having 1 to 20 carbon atoms, a glycidyl group, a glycidoxy group, an epoxy group, a 3,4-epoxycyclohexyl group, an acryloxy group, a methacryloxy group, a mercapto group, a carboxyl group, an acetylacetonyl group; an amino group which may have a substituent such as an amino group, an aminoethylamino group, a phenylamino group; a halogen atom such as a fluorine atom, a chlorine atom, and a bromine atom; and the like can be given.

As examples of the alkenyl group having 2 to 20 carbon atoms, a vinyl group and an allyl group can be given.

l, m, and n individually represent zero or an arbitrary positive integer, provided that l and n are not 0 at the same time.

The repeating unit of the polysilsesquioxane compound (I) is shown by any one of the following formulas (a) to (c), provided that inclusion of the repeating unit shown by (a) and/or (c) is essential.

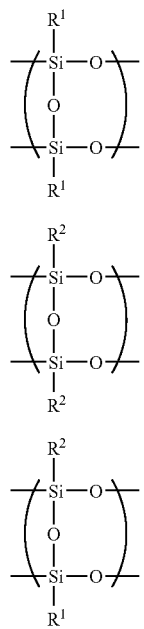

wherein $R^1$ and $R^2$ have the same meanings as defined above.

The polysilsesquioxane compound (I) may be a homopolymer consisting of only one type of the repeating unit shown by the formula (a), a copolymer consisting of two or more types of the repeating unit shown by the formula (a), or a copolymer consisting of the repeating units shown by the formulas (a) to (c). (The repeating unit shown by the formula (c) may bond in the (co)polymer in the inverted form upside down).

When the polysilsesquioxane compound (I) is a copolymer, such a copolymer may be any (co)polycondensate such as a random (co)polymer, a partial block (co)polymer, or a complete block (co)polymer.

The weight average molecular weight (Mw) of the polysilsesquioxane compound (I) is usually 1,000 to 10,000, and preferably 1,500 to 6,000. The weight average molecular weight can be determined as a polystyrene-reduced value by gel permeation chromatography (GPC) using tetrahydrofuran (THF), for example, as a solvent.

The polysilsesquioxane compound (I) has a linearly extended ladder structure. Whether or not the compound has a ladder structure may be confirmed by measuring the infrared absorption spectrum or X-ray diffraction of the compound, for example.

Although not particularly limited, the polysilsesquioxane compound (I) is preferably obtained by condensing a silane compound (1) of the formula (1), $R^1Si(OR^3)_p(X^1)_{3-p}$, and a silane compound (2) of the formula (2), $R^2Si(OR^4)_q(X^2)_{3-q}$, at a molar ratio of 10:90 to 100:0 in the presence of a catalyst.

In the formulas (1) and (2), $R^1$ and $R^2$ have the same meanings as defined above.

$R^3$ in the above formula (1) represents an alkyl group having 1 to 6 carbon atoms. As examples of the alkyl group having 1 to 6 carbon atoms, a methyl group, an ethyl group, an n-propyl group, an isopropyl group, an n-butyl group, a sec-butyl group, an isobutyl group, a t-butyl group, an n-pentyl, and an n-hexyl group can be given. Among these alkyl groups, a methyl group and an ethyl group are preferable from the viewpoint of economy, ease of handling, and the like.

$X^1$ represents a halogen atom such as a fluorine atom, a chlorine atom, or a bromine atom.

p is an integer from 0 to 3. When p is 2 or more, two or more $OR^3$ groups may be the same or different, and when (3−p) is 2 or more, two or more $X^1$ may be either the same or different.

As examples of the silane compound (I), trialkoxysilane groups such as 3-acetoxypropyltrimethoxysilane, 3-acetoxypropyltriethoxysilane, 3-acetoxypropyltripropoxysilane, 3-acetoxypropyltributoxysilane, 3-propionyloxypropyltrimethoxysilane, 3-propionyloxypropyltriethoxysilane, 3-benzoyloxypropyltrimethoxysilane, 3-benzoyloxypropyltriethoxysilane, 3-benzoyloxypropyltripropoxysilane, 3-benzoyloxypropyltributoxysilane, 2-trimethylsilyloxyethyltrimethoxysilane, 3-triethylsilyloxypropyltriethoxysilane, 3-(2-tetrahydropyranyloxy)propyltripropoxysilane, 3-(2-tetrahydrofuranyloxy)propyltributoxysilane, 3-methoxymethyloxypropyltrimethoxysilane, 3-methoxyethoxymethyloxypropyltriethoxysilane, 3-(1-ethoxyethyloxy)propyltripropoxysilane, 3-(t-butoxycarbonyloxy)propyltrimethoxysilane, 3-t-butoxypropyltrimethoxysilane, 3-benzyloxypropyltriethoxysilane, and 3-triphenylmethoxypropyltriethoxysilane; halogenosilane compounds such as 3-acetoxypropyltrichlorosilane, 3-acetoxy propyltribromosilane, 3-acetoxypropyldichloromethoxysilane, 3-acetoxypropyldichloroethoxysilane, 3-acetoxypropylchlorodimethoxysilane, 3-acetoxypropylchlorodiethoxysilane, 3-benzoyloxypropyltrichlorosilane, 3-trimethylsilyloxypropylchlorodimethoxysilane, 3-triethylsilyloxypropyldichloromethoxysilane, 3-(2-tetrahydropyranyloxy)propylchlorodiethoxysilane, 3-(2-tetrahydrofuranyloxy)propyldichloroethoxysilane, 3-methoxymethyloxypropyltribromosilane, 3-methoxyethoxymethyloxyropyltrichlorosilane, 3-(1-ethoxyethyloxy)propylchlorodimethoxysilane, 3-t-butoxycarbonyloxypropyldichloromethoxysilane, 3-t-butoxypropylchlorodiethoxysilane, 3-triphenylmethoxypropyldichloroethoxysilane, and 3-benzyloxypropyltribromosilane; and the like can be given.

These silane compounds may be used either individually or in combination of two or more.

Of these, as the silane compound (1), a silane compound having a 3-acetoxypropyl group is preferable due to the capability of producing a molding material with excellent heat resistance.

In the formula (2), $R^4$ represents the same alkyl groups having 1 to 6 carbon atoms as $R^3$, and $X^2$ represents the same halogen atoms as $X^1$.

q indicates an integer from 0 to 3. When q is 2 or more, the two or more groups represented by $OR^4$ may be either the same or different, and when (3−q) is 2 or more, the two or more $X^2$s may be either the same or different.

Specific examples of the silane compound (2) include substituted or unsubstituted phenylsilane compounds such as phenyltrimethoxysilane, 4-chlorophenyltrimethoxysilane, phenyltriethoxysilane, 2-methoxyphenyltriethoxysilane, phenyldimethoxyethoxysilane, phenyldiethoxymethoxysilane, phenyltrichlorosilane, phenylchlorodimethoxysilane, phenyldichloromethoxysilane, phenyltribromosilane, phenylchloromethoxyethoxysilane, 4-chlorophenyltrichlorosilane, phenyltrichlorosilane, and 2-methoxyphenyltrichlorosilane;
alkylsilane compounds such as methyltrimethoxysilane, methyltriethoxysilane, ethyltrimethoxysilane, ethyltriethoxysilane, n-propyltrimethoxysilane, n-butyltriethoxysilane, isobutyltrimethoxysilane, n-pentyltriethoxysilane, n-hexyltrimethoxysilane, iso-octyltriethoxysilane, dodecyltrimethoxysilane, methyldimethoxyethoxysilane, methyldiethoxymethoxysilane, methyltrichlorosilane, methylchlorodimethoxysilane, methyldichloromethoxysilane, methyltribromosilane, methylchlorodiethoxysilane, ethyltrichlorosilane, ethylchlorodimethoxysilane, ethyldichloromethoxysilane, ethyltribromosilane, n-propyltrichlorosilane, n-propylchlorodimethoxysilane, and n-propyldichloromethoxysilane;
substituted or unsubstituted alkylsilane compounds such as glycidyltrimethoxysilane, glycidyltriethoxysilane, glycidyltripropoxysilane, glycidyltributoxysilane, glycidyltrichlorosilane, glycidylchlorodimethoxysilane, glycidyldichloromethoxysilane, glycidylchlorodiethoxysilane, glycidyldichloroethoxysilane, glycidyltribromosilane, 3-glycidoxypropyltrimethoxysilane, 3-glycidoxypropyltriethoxysilane, 3-glycidoxypropyltripropoxysilane, 3-glycidoxypropyltributoxysilane, 3-glycidoxypropyltrichlorosilane, 3-glycidoxypropylchlorodimethoxysilane, 3-glycidoxypropyldichloromethoxysilane, 3-glycidoxypropylchlorodiethoxysilane, 3-glycidoxypropyldichloroethoxysilane, 3-glycidoxy propyltribromosilane, 2-(3,4-epoxycyclohexyl)ethyltrimethoxysilane, 2-(3,4-epoxycyclohexyl)ethyltriethoxysilane, 2-(3,4-epoxycyclohexyl)ethyltripropoxysilane, 2-(3,4-epoxycyclohexyl)ethyltributoxysilane, 3-acryloxypropyltrimethoxysilane, 3-acryloxypropyltriethoxysilane, 3-acryloxypropyltripropoxysilane, 3-acryloxypropyltributoxysilane, 3-methacryloxypropyltrimethoxysilane, 3-methacryloxypropyltriethoxysilane, 3-methacryloxypropyltripropoxysilane, 3-methacryloxypropyltributoxysilane, 3-methacryloxypropyltrichlorosilane, 3-methacryloxypropylchlorodimethoxysilane, 3-methacryloxypropyldichloromethoxysilane, 3-methacryloxypropylchlorodiethoxysilane, 3-methacryloxypropyldichloroethoxysilane, 3-methacryloxypropyltribromosilane, 3-[(2-aminoethyl)amino]propyltrimethoxysilane, 3-aminopropyltrimethoxysilane, 3-phenylaminopropyltrimethoxysilane, 3-chloropropyltrimethoxysilane, 3-mercaptopropyltrimethoxysilane, 3-mercaptopropyltriethoxysilane, 3-mercaptopropyltripropoxysilane, 3-mercaptopropyltributoxysilane, 3-mercaptopropyltrichlorosilane, 3-mercaptopropylchlorodimethoxysilane, 3-mercaptopropyldichloromethoxysilane, 3-mercaptopropylchlorodiethoxysilane, 3-mercaptopropyldichloroethoxysilane, and 3-mercaptopropyltribromosilane;
alkenylsilane compounds such as vinyltrimethoxysilane, vinyltriethoxysilane, vinyltripropoxysilane, vinyltributoxysilane, and allyltrimethoxysilane; and the like.

These silane compounds may be used either individually or in combination of two or more.

The molar ratio of the silane compound (1) to the silane compound (2) can be arbitrary determined from a range of 10:90 to 100:0, but preferably is 20:80 to 70:30, and more preferably 25:75 to 60:40. A polysilsesquioxane compound which can produce a cured product with excellent heat resistance can be obtained by using the silane compound (1) and silane compound (2) in a ratio of the above ranges.

An acid catalyst or a base catalyst can be used as a catalyst for condensation reaction of the silane compound (1) and the silane compound (2).

As examples of the acid catalyst, an inorganic acid such as hydrochloric acid, sulfric acid, nitric acid, and phosphoric acid and an organic acid such as methanesulfonic acid, trifluoromethanesulfonic acid, benzensulfonic acid, p-toluenesulfonic acid, acetic acid, and trifluoroacetic acid can be given.

As examples of the base catalyst, organic bases such as trimethylamine, triethylamine, lithium diisopropylamide, lithium bis(trimethylsilyl)amide, pyridine, 1,8-diazabicyclo[5.4.0]-7-undecene, aniline, picoline, 1,4-diazabicyclo[2.2.2]octane, and imidazole; organic base hydroxides such as tetramethylammonium hydroxide and tetraethylammonium hydroxide; metal alcoholates such as sodium methoxide, sodium ethoxide, sodium t-butoxide, and potassium t-butoxide; metal hydrides such as sodium hydride and calcium hydride; metal hydroxides such as sodium hydroxide, potassium hydroxide, and calcium hydroxide; metal carbonates such as sodium carbonate, potassium carbonate, and magnesium carbonate; metal hydrogencarbonates such as sodium hydrogencarbonate, and potassium hydrogencarbonate; and the like can be given.

The amount of the catalyst used is usually 0.1 to 10 mol %, and preferably 1 to 5 mol % of the total mol content of the silane compound (1) and silane compound (2) (hereinafter referred to simply as "silane compounds" from time to time).

There are no particular limitations to the method for obtaining a polysilsesquioxane compound by condensation of the silane compound in the presence of the catalyst. For example, a method of adding the catalyst to a solution of the silane compounds and stirring the mixture can be given.

As examples of the solvent used for the reaction, water; aromatic hydrocarbons such as benzene, toluene, and xylene; esters such as methyl acetate, ethyl acetate, propyl acetate, and methyl propionate; ketones such as acetone, methyl ethyl ketone, methyl isobutyl ketone, and cyclohexanone; alcohols such as methyl alcohol, ethyl alcohol, n-propyl alcohol, isopropyl alcohol, n-butyl alcohol, isobutyl alcohol, sec-butyl alcohol, and t-butyl alcohol; and the like can be given. These solvents may be used either individually or in combination of two or more.

Of these, water, aromatic hydrocarbons, and a mixture of these are preferable, with a particularly preferable solvent being a mixture of water and toluene. When water and toluene are used, the ratio (volume ratio) of water to toluene is preferably 1:9 to 9:1 and more preferably 7:3 to 3:7.

The solvent is used in an amount of 1 liter for usually 0.1 to 10 mol, and preferably 0.5 to 10 mol of the silane compounds.

The condensation reaction temperature of the silane compounds is usually in the range from 0° C. to the boiling point of the solvent used, and preferably in the range of 20° C. to 110° C. If the temperature is too low, the condensation reaction proceeds only insufficiently. On the other hand, if the temperature is too high, inhibition of gel production is difficult. The reaction time is usually from 30 minutes to 20 hours.

The reaction is terminated by adding an aqueous solution of an alkali such as sodium hydrogencarbonate to the reaction solution when an acid catalyst is used and by adding an acid such as a hydrochloric acid when a base catalyst is used. A salt produced in this instance may be removed by filtration, washing, or the like to obtain the target polysilsesquioxane compound (I).

The molding material of the present invention may consist only of a polysilsesquioxane compound (I) or may be a composition obtained by adding other components to the polysilsesquioxane compound (I) to the extent that the object of the present invention is not inhibited.

As such other components, an antioxidant, a UV absorber, a photostabilizer, a diluent, a silane coupling agent, and the like can be given.

The antioxidant is added to prevent deterioration due to oxidation during heating.

As examples of the antioxidant, a phenol-based antioxidant, a sulfur-containing antioxidant, a phosphorus-containing antioxidant, and the like can be given.

As specific examples of the phenol-based antioxidant, monophenols such as 2,6-di-t-butyl-p-cresol, dibutylhydroxytoluene, butylated hydroxyanisole, 2,6-di-t-butyl-p-ethylphenol, and stearyl-β-(3,5-di-t-butyl-4-hydroxyphenyl) propionate; bisphenols such as 2,2'-methylenebis(4-methyl-6-t-butylphenol), 2,2'-methylenebis(4-ethyl-6-t-butylphenol), 4,4'-thiobis(3-methyl-6-t-butylphenol), 4,4'-butylidenebis(3-methyl-6-t-butylphenol), and 3,9-bis[1,1-dimethyl-2-{β-(3-t-butyl-4-hydroxy-5-methylphenyl) propionyloxy}ethyl]-2,4,8,10-tetraoxaspiro[5,5]undecane; and polymer phenols such as 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis[methylene-3-(3', 5'-di-t-butyl-4'-hydroxyphenyl)propionate]methane, bis[3, 3'-bis-(4'-hydroxy-3'-t-butylphenyl)butylic acid]glycol ester, 1,3,5-tris(3'5'-di-t-butyl-4'-hydroxybenzyl)-S-triazine-2,4,6-(1H,3H,5H)tri-on, and tocopherol can be given.

Examples of the sulfur-containing antioxidant include dilauryl-3,3'-thiodipropionate, dimyristyl-3,3'-thiodipropionate, and distearyl-3,3'-thiodipropionate, and the like.

Examples of the phosphorus-containing antioxidant include phosphite compounds such as triphenylphosphite, diphenylisodecylphosphite, phenyldiisodecylphosphite, tris(nonylphenyl)phosphite, diisodecylpentaerythritolphosphite, tris(2,4-di-t-butylphenyl)phosphite, cyclic neopentan-tetra-ylbis(octadecyl)phosphite, cyclic neopentan-tetra-ylbis(2,4-di-t-butylphenyl)phosphite, cyclic neopentan-tetra-ylbis(2,4-di-t-butyl-4-methylphenyl)phosphite, and bis[2-t-butyl-6-methyl-4-{2-(octadecyloxycarbonyl)ethyl}phenyl]hydrogen phospite; oxaphosphaphenanthrene oxides such as 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, and 10-decyloxy-9,10-dihydro-9-oxa-10-phosphaphenanthrene-10-oxide can be given.

These antioxidants may be used either individually or in combination of two or more. The antioxidant is used in an amount of usually 0.01 to 10 parts by weight per 100 parts by weight of the polysilsesquioxane compound.

A UV absorber is added in order to increase light resistance of the molding material.

As examples of the UV absorber, salicylic acids such as phenyl salicylate, p-t-butylphenyl salicylate, and p-octylphenyl salicylate; benzophenones such as 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, and 2-hydroxy-4-methoxy-5-sulfobenzophenone; benzotriazoles such as 2-(2'-hydroxy-5'-methylphenyl)benzotriazole, 2-(2'-hydroxy-5'-tert-butylphenyl)benzotriazole, 2-(2'-hydroxy-3',5'-ditert-butylphenyl)benzotriazole, 2-(2'-hydroxy-3'-tert-butyl-5'-methylphenyl)-5-chlorobenzotriazole, 2-(2'-hydroxy-3',5'-ditert-butylphenyl)-5-chlorobenzotriazole, 2-(2'-hydroxy-3', 5'-ditert-amylphenyl)benzotriazole, and 2-{(2'-hydroxy-3', 3",4",5",6"-tetrahydrophthalimidemethyl)-5'-methylphenyl}benzotriazole; hindered amines such as bis(2, 2,6,6-tetramethyl-4-piperidyl)sebacate, bis(1,2,2,6,6-pentamethyl-4-piperidyl)sebacate, and bis(1,2,2,6,6-pentamethyl-4-piperidyl)[{3,5-bis(1,1-dimethylethyl)-4-hydroxyphenyl}methyl]butylmalonate; and the like can be given.

These UV absorbers may be used either individually or in combination of two or more. The UV absorbers are used in an amount of usually 0.01 to 10 parts by weight per 100 parts by weight of the polysilsesquioxane compound.

A photostablizer is added in order to increase light resistance of the molding material.

As examples of the photostabilizer, hindered amines such as poly[{6-(1,1,3,3-tetramethylbutyl)amino-1,3,5-triazine-2, 4-diyl}{(2,2,6,6-tetramethyl-4-piperidine) imino}hexamethylene{(2,2,6,6-tetramethyl-4-piperidine) imino}] and the like can be given.

These photostabilizers may be used either individually or in combination of two or more. The photostabilizer is used in an amount of usually 0.01 to 10 parts by weight per 100 parts by weight of the silsesquioxane compound.

A diluent is added to adjust viscosity of the molding material.

As examples of the diluent, glycerol diglycidyl ether, butanediol diglycidyl ether, diglycidyl aniline, neopentyl glycol glycidyl ether, cyclohexanedimethanol diglycidyl ether, alkylene diglycidyl ether, polyglycol diglycidyl ether, polypropylene glycol diglycidyl ether, trimethylolpropane triglycidyl ether, glycerol triglycidyl ether, 4-vinylcyclohexene mono-oxide, vinylcyclohexene dioxide, and methylated vinylcyclohexene dioxide can be given. These diluents may be used either individually or in combination of two or more.

A silane coupling agent is added in order to increase adhesion of the molding material to the other materials.

As examples of the silane coupling agents, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, vinyltriethoxysilane, and the like can be given.

Although the molding material of the present invention contains the polysilsesquioxane compound (I) having a ladder structure as a major component, it may contain polysilsesquioxane compounds having a random structure or a basket structure to the extent that the effect of the present invention is not inhibited.

As described later, the molding material of the present invention may be used to seal an optical element by curing the polysilsesquioxane compound (I). Although the molding material of the present invention may contain a curing agent, curing can be carried out smoothly without a curing agent. In order to maintain excellent transparency and excellent heat resistance for a long time, it is preferable to not use a curing agent since the use of a curing agent may cause deterioration.

When a curing agent is used, as the curing agent, an acid anhydride, an aromatic amine, a phenol resin, a photoinitiator, and the like can be used.

The molding material of the present invention may be produced by adding one or more components mentioned above to the polysilsesquioxane compound (I) and mixing the mixture.

The molding material of the present invention may be used as an electric insulator such as a semiconductor (e.g. IC) sealing material, an optical element (e.g. LED) sealing material, and a material for printed circuit boards; a building material such as a lamp cover, a window material, and the like. Of these, the molding material is preferably used as a sealing material. Because of the excellent heat resistance and excellent transparency, the molding material is preferably used as a sealing material for optical elements.

A cured product of the molding material exhibits excellent transparency and excellent heat resistance for a long time without reducing transparency due to coloration by high energy light and heat emitted by an optical element which emits luminescence with a short wavelength and high brightness.

Long-lasting superior heat resistance of the cured products of the sealing material for optical elements of the present invention can be confirmed by, for example, occurrence of almost no decrease in transparency when the cured products of the sealing material for optical elements is placed under conditions of high temperature for a long period of time (for example, 500 hours at 150° C.).

2) Sealed Optical Element

The sealed optical element of the present invention comprises an optical element sealed with the cured product of the sealing material (for optical elements) of the present invention.

As examples of the optical elements, light emitting elements such as an LED and an LD, a light-receiving element, a composite optical element, an optical integrated circuit, and the like can be given.

The sealed optical element of the present invention can be obtained by molding the sealing material for optical elements of the present invention into a desired form, enclosing an optical element therein, and curing the formed sealing material, for example.

Various methods may be used as the means for molding the sealing material for optical elements of the present invention into a desired form. For example, a common method such as a general transfer molding method, a casting method, and the like can be used.

As a method for curing the formed product in which the optical element has been enclosed, a method of heating the cured product, a method of adding the above-mentioned curing agent to the sealing material and curing the molded product, a combination of these methods, and the like can be given. Among these methods, the method of heating is preferable. Since a polysilsesquioxane compound obtained by condensation of a specific silane compound is used in the present invention, a cured product can be obtained in high yield only by heating without using a curing agent.

When curing with heating is used, the temperature is usually in a range of 100 to 200° C. although the heating temperature differs according to the type of the sealing material for optical elements used. The heating time is usually from 10 minutes to 20 hours, and preferably from 30 minutes to 10 hours.

One example of the sealed optical element of the present invention is shown in FIG. 1. FIG. 1(A) shows a lamp-shaped sealed LED (10A) in which an optical element (LED chip) (14a) is sealed with a cured product (11) of the sealing material for optical elements of the present invention which is molded into a lamp shape.

FIG. 1(B) shows an SMD (Surface Mount Device)-type sealed LED (10B) comprising a rectangular parallelepiped casing (13) having an LED chip (14b) mounted on the bottom thereof, an opening on top, and a cured product (11) of the sealing material for optical elements of the present invention filled therein. In FIG. 1(B), 15 indicates wiring of the LED chip.

The sealed optical element shown in FIG. 1 can be prepared as follows.

The lamp-shaped sealed LED (10A) is prepared by using a mold (12) having a lamp-shaped recess shown in FIG. 2(a) and FIG. 2(b). FIG. 2(a) shows a cross-sectional view of the mold (12) in the X-Y direction, and FIG. 2(b) shows a top view of the mold (12).

As shown in FIG. 3(a), the sealing material for optical elements (11a) of the present invention is injected into the mold (12) using a sealing material injector (16). For simplicity, only a nozzle of the sealing material injector (16) is shown in FIG. 3(a).

First, an LED chip (14a) is inserted in an appropriate position as shown in FIG. 3(b). Then, the entire object is heated to a prescribed temperature to cure the sealing material for optical elements and integrate the LED chip (14a) with the sealing material as shown in FIG. 3(c). The lamp-shaped sealed LED (10A) can be obtained by removing the integrated object from the mold (12) as shown in FIG. 3(d).

An SMD-type sealed LED (10B) can be prepared by using a rectangular parallelepiped casing (13) having an LED chip (14b) mounted on the bottom and an opening on the top as shown in FIG. 4(a) and FIG. 4(b). FIG. 4(a) shows a cross-sectional view of the rectangular parallelepiped casing (13) in the X'-Y' direction, and FIG. 4(b) shows a top view of the rectangular parallelepiped casing (13).

As shown in FIG. 5(a), the sealing material for optical elements (11a) of the present invention is injected into the rectangular parallelepiped casing (13) using a sealing material injector (16). For simplicity, only a nozzle of the sealing material injector (16) is shown in FIG. 5(a).

The SMD-type sealed LED (10B) shown in FIG. 5(b) can be prepared by heating the entire object to a prescribed temperature and curing the sealing material for optical elements (11a).

Because of the use of the sealing material of the present invention, the sealed optical element of the present invention is free from deterioration of color by heat and light, even if the optical element has a short wavelength of luminescence peak wavelength in a range of 350 to 490 nm, such as a white or blue light-emitting LED and the like.

EXAMPLES

The present invention is further described below by way of examples and comparative examples. Note that the present invention is not limited to the following examples.

(Measurement of Weight Average Molecular Weight)

The weight average molecular weight (Mw) was determined as a polystyrene-reduced value by gel permeation chromatography (GPC) using tetrahydrofuran (THF) as a solvent.

The measurement was carried out using a GPC measurement device ("HLC-8220 GPC", manufactured by Tosoh Corporation) under the following conditions.

Column: TSKgel GMHXL→TSKgel GMHXL→TSKgel 12000 HXL
Solvent: THF
Temperature: 40° C.
Flow rate: 1 ml/min
Detector: differential refractometer Example 1

A 200 ml eggplant-shaped flask equipped with a stirrer was charged with 3.97 g (20 mmol) of phenyltrimethoxysilane (manufactured by Tokyo Kasei Kogyo Co., Ltd.) as a silane compound (2), 4.45 g (20 mmol) of 3-acetoxypropyltrimethoxysilane (manufactured by AZmax Co., Ltd.) as a silane compound (1), 20 ml of toluene as a solvent, and 10 ml of distilled water. Then, 0.10 g (1 mmol) of phosphoric acid (manufactured by Kanto Chemical Co., Inc.) was added as a catalyst while stirring the mixture, followed by stirring at room temperature for 16 hours. After the reaction was complete, a saturated aqueous solution of sodium hydrogencarbonate was added to neutralize the reaction mixture. The mixture was allowed to stand for a short time, toluene and water were removed, and the residue was washed twice with distilled water. The resulting residue was dissolved in 100 ml of 2-butanone and dried with anhydrous magnesium sulfate. After separating the anhydrous magnesium sulfate by filtration, the filtrate was added dropwise to a large quantity of n-hexane to cause reprecipitation. After removing the n-hexane, the precipitate was dissolved in tetrahydrofuran (THF) to recover the resulting product. After evaporating the THF by an evaporator, the residue was dried under vacuum to obtain a polysilsesquioxane compound (weight average molecular weight (Mw)=2,400). The resulting compound was used as a sealing material for optical elements, as is, without additives.

Example 2

A polysilsesquioxane compound (weight average molecular weight (Mw)=2,500) and a sealing material for optical elements were obtained in the same manner as in Example 1 except for using 0.10 g (1 mmol) of methanesulfonic acid (manufactured by Tokyo Kasei Kogyo Co., Ltd.) instead of phosphoric acid as a catalyst.

Example 3

The same reaction as in Example 1 was carried out except for using 0.10 g (1 mmol) of triethylamine (manufactured by Tokyo Kasei Kogyo Co., Ltd.) instead of phosphoric acid as a catalyst. After adding 50 ml of ethyl acetate and 50 ml of THF, the reaction mixture was neutralized with a 0.1 N hydrochloric acid aqueous solution. After having been allowed to stand for a while, the organic layer was collected and washed twice with distilled water and dried over anhydrous magnesium sulfate. After separating the anhydrous magnesium sulfate by filtration, the filtrate was added dropwise to a large quantity of n-hexane to cause reprecipitation. After removing the n-hexane, the precipitate was dissolved in tetrahydrofuran (THF) to recover the resulting product. After evaporating the THF by an evaporator, the residue was dried under vacuum to obtain a polysilsesquioxane compound (weight average molecular weight (Mw)=6,500). The resulting compound was used as a sealing material for optical elements, as is, without additives.

Example 4

A polysilsesquioxane compound (weight average molecular weight (Mw)=2,900) and a sealing material for optical elements were obtained in the same manner as in Example 1 except for using 5.95 g (30 mmol) of phenyltrimethoxysilane and 2.22 g (10 mmol) of 3-acetoxypropyltrimethoxysilane.

Example 5

A polysilsesquioxane compound (weight average molecular weight (Mw)=1,800) and a sealing material for optical elements were obtained in the same manner as in Example 1 except for using 1.98 g (10 mmol) of phenyltrimethoxysilane and 6.67 g (30 mmol) of 3-acetoxypropyltrimethoxysilane.

Example 6

A polysilsesquioxane compound (weight average molecular weight (Mw)=2,500) and a sealing material for optical elements were obtained in the same manner as in Example 1 except for using 3.97 g (20 mmol) of phenyltrimethoxysilane and 4.00 g (18 mmol) of 3-acetoxypropyltrimethoxysilane, and further using 0.47 g (2 mmol) of 3-glycidoxypropyltrimethoxysilane (manufactured by Tokyo Kasei Kogyo Co., Ltd.).

Production Example 1

A stirrer bar was put into a 50 ml two-mouth eggplant flask equipped with a thermometer and a calcium chloride tube. The flask was charged with 5.13 g (40 mmol) of allyl valerate (manufactured by Aldrich Co.) and 0.2 g of a platinum catalyst ("BY 24-835" manufactured by a Toray-Dow Corning Co.). Then, 4.89 g (40 mmol) of trimethoxysilane (manufactured by Tokyo Kasei Kogyo Co., Ltd.) was added while stirring and controlling the temperature at 50° C. or less. After further addition of 0.2 g of the platinum catalyst, the mixture was reacted at room temperature for six hours. After completion of the reaction, the reaction mixture was distilled under reduced pressure using a Kugelrohr distillation apparatus to obtain 8.12 g of 3-trimethoxysilylpropyl valerate of the silane compound (1).

Production Example 2

7.97 g of 3-trimethoxysilylpropyl benzoate of silane compound (1) was obtained in the same manner as in Production Example (1) except that 6.49 g (40 mmol) of allylbenzoic acid (manufactured by Tokyo Kasei Kogyo Co., Ltd.) was used instead of 40 mmol of ally valerate.

Example 7

The same reaction as in Example 1 was carried out except for using 5.01 g (20 mmol) of 3-trimethoxysilylpropyl valerate synthesized in Production Example 1 instead of 4.45 g (20 mmol) of 3-acetoxypropyltrimethoxysilane as the silane compound (1). After the reaction, 50 ml of ethyl acetate was added to the reaction solution and a saturated aqueous solution of sodium hydrogencarbonate was added to neutralize the reaction solution. The organic layer was separated. After washing twice with distilled water, the organic layer was dried over anhydrous magnesium sulfate. After separating the anhydrous magnesium sulfate by filtration, the filtrate was added dropwise to a large quantity of n-hexane to cause reprecipitation. After removing the n-hexane, the precipitate was dissolved in THF. After evaporating the THF by evaporator, the resulting residue was dried under vacuum to obtain the target polysilsesquioxane compound (weight average molecular weight (Mw)=2,800) and a sealing material for optical elements.

Example 8

A polysilsesquioxane compound (weight average molecular weight (Mw)=3,100) and a sealing material for optical elements were obtained in the same manner as in Example 7 except for using 5.69 g (20 mmol) of 3-trimethoxysilylpropyl benzoate synthesized in Production Example 2 instead of 5.01 g (20 mmol) of 3-trimethoxysilylpropyl valerate as the silane compound (1).

Comparative Example 1

A polysilsesquioxane compound (weight average molecular weight (Mw)=2,200) and a sealing material for optical elements were obtained in the same manner as in Example 1 except for using 4.73 g (20 mmol) of 3-glycidoxypropyltrimethoxysilane instead of 3-acetoxypropyltrimethoxysilane as the silane compound (1) and 0.10 g (1 mmol) of methanesulfonic acid instead of phosphoric acid.

Comparative Example 2

A sealing material for optical elements made of an epoxy resin composition was obtained by sufficiently mixing 2 g of 3,4-epoxycyclohexylmethyl 3,4-epoxycyclohexanecarboxylate (manufactured by Aldrich), 1 g of 2,2-bis(4-glycidyloxyphenyl)propane (manufactured by Tokyo Kasei Kogyo Co., Ltd.), 3 g of 4-methylcyclohexane-1,2-dicarboxylic anhydride (manufactured by Tokyo Kasei Kogyo Co., Ltd.), and 0.03 g of triphenylphosphine (manufactured by Kanto Chemical Co., Inc.) in a 20 ml glass tube.

The initial transparency and the transparency after heat test were measured to evaluate transparency and heat resistance of the sealing materials for optical elements obtained in Examples 1 to 6 and Comparative Examples 1 and 2 according to the following methods. The results are shown in Table 1.

(Measurement of Initial Transparency)

The polysilsesquioxane compounds were poured into a mold with a length of 25 mm, a width of 20 mm, and a thickness of 1 mm and cured by heating at 135° C. for 12 hours to obtain test specimens. The initial transparency of the resulting specimens at wavelengths of 365 nm, 400 nm, 450 nm, and 500 nm were measured by a spectrophotometer ("MPC-3100" manufactured by Shimadzu Corporation).

(Measurement of Transparency after Heating)

After measuring the initial transparency, the specimens were heated in an oven at 150° C. for 100 hours and 500 hours. The transparency after heating at wavelengths of 365 nm, 400 nm, 450 nm, and 500 nm was measured.

(Transparency)

A sample having initial transparency of 85% or more at a wavelength of 400 nm was evaluated as "Good", initial transparency of 70% or more and less than 85% was evaluated as "Fair", and initial transparency of less than 70% was evaluated as "Bad".

(Heat Resistance)

The value calculated using the initial transparency and the transparency after heating at 150° C. for 500 hours at a wavelength of 400 nm was applied to the following expression. The heat resistance was evaluated as "Good" if the resulting value was 70 or more, as "Fair" if 50 or more and less than 70, and as "Bad" if less than 50.

(Transparency after heating at wavelength of 400 nm/initial transparency at wavelength of 400 nm)×100

As shown in Table 1, a cured product (sealing material) with excellent transparency and heat resistance can be produced by using the sealing materials for optical elements obtained in Examples 1 to 6.

On the other hand, the sealing materials for optical elements obtained in Comparative Example 1 were inferior in heat resistance as demonstrated by the remarkably decreased transparency after the heat test.

The sealing material for optical elements obtained in Comparative Example 2 had low initial transparency (especially at 365 nm and 400 nm). Also, the transparency after the heat test decreased substantially.

BRIEF DESCRIPTION OF THE DRAWINGS

FIG. 1 is a view showing an example of the sealed optical element according to the present invention.

Figure 2:
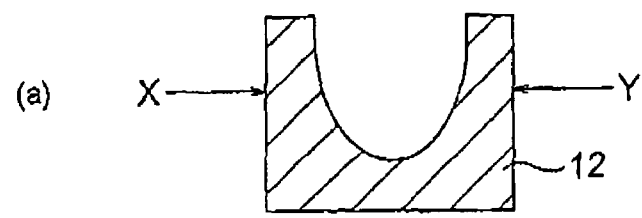
FIG. 2(a) shows a cross-sectional view of a mold used for preparation of a lamp-shaped sealed LED.
FIG. 2(b) shows a top view of the mold.
Figure 2:
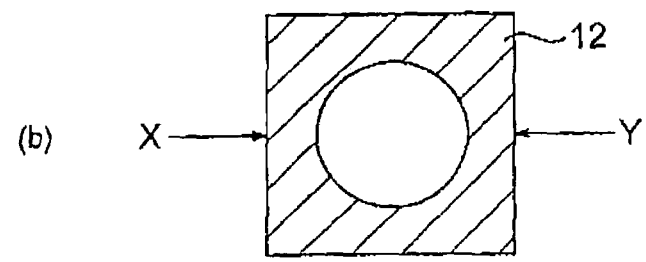

FIG. 2 is a schematic view of the mold used for fabricating a lamp-type sealed LED.

Figure 3:
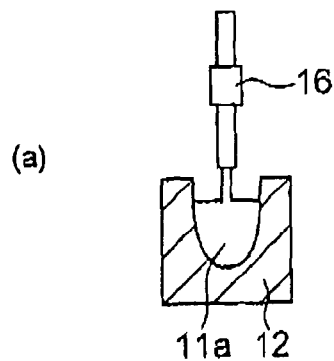
FIG. 3 (FIGS. 3(a) to 3(d)) shows the lamp-sealed LED of the present invention.
Figure 3:
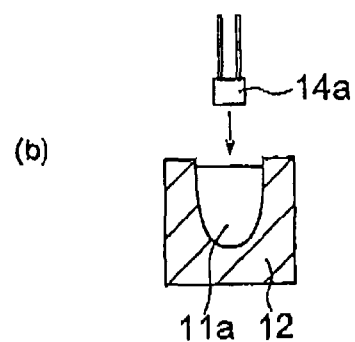
Figure 3:
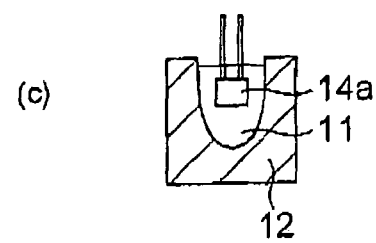
Figure 3:
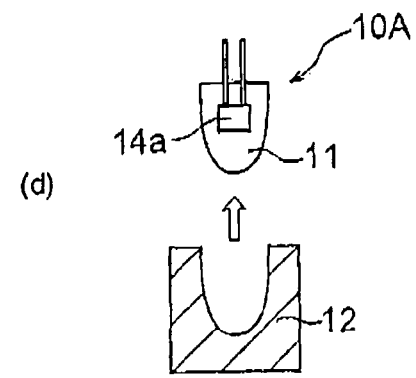

FIG. 3 is a sectional view showing the process of fabricating a lamp-type sealed LED.

Figure 4:
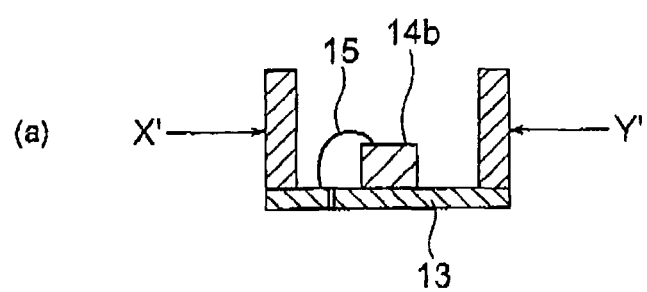
FIG. 4(a) shows a cross-sectional view of a rectangular parallelepiped casing used for preparation of the SMD-type sealed LED of the present invention.
FIG. 4(b) shows a top view of the rectangular parallelepiped casing.
Figure 4:
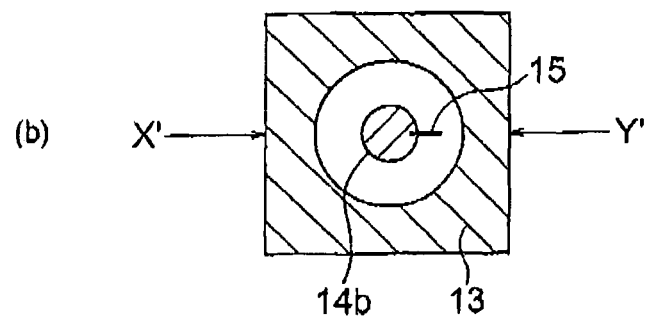

FIG. 4 is a schematic view of the rectangular parallelepiped casing used for fabricating an SMD-type sealed LED.

Figure 5:
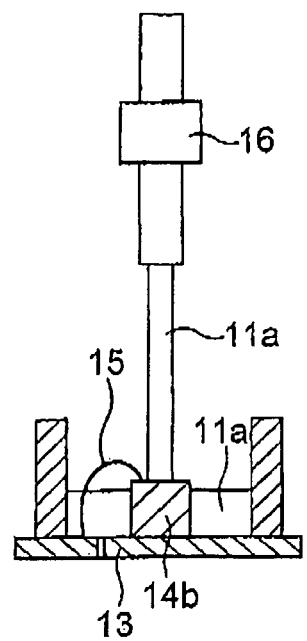
FIG. 5 (FIG. 5(a) and FIG. 5(b)) shows the SMD-type sealed LED of the present invention.
Figure 5:
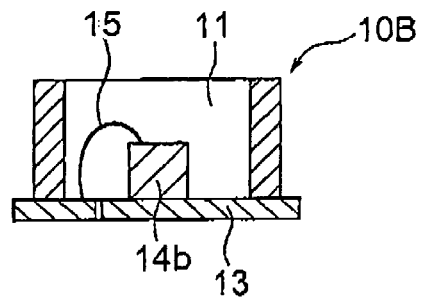

FIG. 5 is a sectional view showing the process of fabricating an SMD-type sealed LED.

EXPLANATION OF SYMBOLS

10A Lamp-type sealed LED
10B SMD-type sealed LED
11 Cured product of sealing material for optical element of the present invention
11a Sealing material for optical element of the present invention
12 Mold
13 Rectangular parallelepiped casing
14a, 14b LED chips
15 Wiring
16 Apparatus for charging sealing material for optical element (nozzle)

What is claimed is:

1. A molding material containing a polysilsesquioxane compound in an amount of 70 wt % or more of the total amount of the molding material that has a ladder structure having a repeating unit shown by the formula (I):

TABLE 1

| | | Weight average molecular weight (Mw) | Transparency (%) | | | | | | | | | | | | Transparency | Heat resistance |
| --- | --- | --- | --- | --- | --- | --- | --- | --- | --- | --- | --- | --- | --- | --- | --- | --- |
| | | | Initial | | | | After heating for 100 hours | | | | After heating for 500 hours | | | | | |
| | | | 365 nm | 400 nm | 450 nm | 500 nm | 365 nm | 400 nm | 450 nm | 500 nm | 365 nm | 400 nm | 450 nm | 500 nm | | |
| Example | 1 | 2400 | 90.3 | 90.9 | 91.4 | 91.6 | 86.6 | 88.4 | 89.7 | 90.4 | 84.3 | 87.5 | 89.5 | 90.6 | Good | Good |
| | 2 | 2500 | 90.3 | 90.9 | 91.4 | 91.6 | 78.8 | 85.4 | 89.2 | 90.5 | 68.4 | 77.2 | 86.0 | 89.4 | Good | Good |
| | 3 | 6500 | 90.1 | 90.5 | 91.2 | 91.5 | 82.1 | 87.3 | 89.5 | 90.2 | 79.4 | 84.5 | 87.9 | 89.6 | Good | Good |
| | 4 | 2900 | 87.7 | 89.1 | 89.8 | 90.3 | 85.1 | 86.7 | 88.4 | 89.8 | 80.6 | 83.9 | 86.2 | 88.7 | Good | Good |
| | 5 | 1800 | 88.1 | 89.9 | 90.6 | 91.2 | 85.9 | 88.2 | 89.8 | 91.0 | 78.2 | 85.7 | 89.7 | 91.2 | Good | Good |
| | 6 | 2500 | 87.5 | 89.2 | 90.0 | 90.8 | 84.5 | 88.1 | 90.0 | 90.8 | 76.9 | 85.1 | 89.1 | 90.4 | Good | Good |
| | 7 | 2800 | 91.7 | 90.8 | 89.3 | 85.1 | 91.5 | 90.7 | 88.5 | 82.0 | 90.9 | 89.7 | 83.3 | 72.8 | Good | Good |
| | 8 | 3100 | 90.5 | 89.7 | 88.3 | 85.8 | 89.2 | 88.1 | 86.0 | 83.1 | 89.0 | 88.3 | 84.9 | 81.4 | Good | Good |
| Comparative Example | 1 | 2200 | 84.7 | 89.3 | 90.1 | 90.9 | 8.9 | 15.4 | 39.8 | 63.2 | 0.9 | 7.4 | 29.3 | 58.5 | Good | Bad |
| | 2 | — | 0.8 | 47.9 | 82.2 | 88.7 | 0.8 | 22.7 | 62.3 | 84.1 | 0.8 | 13.5 | 50.4 | 75.0 | Bad | Bad |

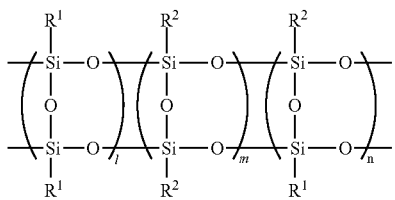

(I)

wherein $R^1$ represents a group shown by the formula AO—$(CH_2)_r$—, wherein A is a group selected from the group consisting of an acetyl group, a propionyl group, a benzoyl group, a trimethylsilyl group, a triethylsilyl group, a tert-butyldimethylsilyl group, a t-butyldiphenylsilyl group, a methoxymethyl group, a methoxyethoxymethyl group, a 1-ethoxyethyl group, a tetrahydropyran-2-yl group, a tetrahydrofuran-2-yl group, a tert-butoxycarbonyl group, a t-butyl group, an octyl group, a benzyl group, a p-methoxybenzyl group, a fluorenyl group, a trityl group, and a benzhydryl group, and r is an integer of 1 to 10, $R^2$ represents a phenyl group that may be substituted with an alkyl group, a halogen atom or an alkoxy group, or an alkyl group having 1 to 20 carbon atoms, and l, m, and n individually represent 0 or an arbitrary integer, provided that l and n are not 0 at the same time.

2. The molding material according to claim 1, wherein the polysilsesquioxane compound is obtained by condensing a silane compound (1) shown by the formula (1), $R^1Si(OR^3)_p(X^1)_{3-p}$ (wherein $R^1$ has the same meaning as above, $R^3$ represents an alkyl group having 1 to 6 carbon atoms, $X^1$ indicates a halogen atom, and p is an integer from 0 to 3), and a silane compound (2) shown by the formula (2), $R^2Si(OR^4)_q(X^2)_{3-q}$ (wherein $R^2$ has the same meaning as above, $R^4$ represents an alkyl group having 1 to 6 carbon atoms, $X^2$ indicates a halogen atom, and q is an integer from 0 to 3), at a molar ratio of silane compound (1):silane compound (2) is 10:90 to 100:0.

3. The molding material according to claim 1, wherein the polysilsesquioxane compound is a compound having a weight average molecular weight of 1,000 to 10,000.

4. The molding material according to claim 1, which does not contain a curing agent.

5. A sealing material comprising the molding material according to claim 1.

6. The sealing material according to claim 5, which is an optical element sealing material.

7. A sealed optical element in which an optical element is sealed with a cured product of the sealing material according to claim 6.

8. A molding material comprising a polysilsesquioxane compound with a ladder structure consisting of a repeating unit shown by the formula (I):

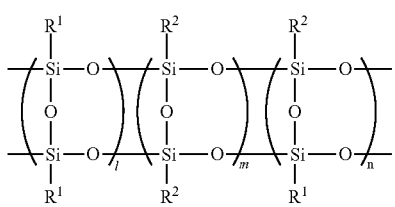

(I)

wherein $R^1$ represents a group shown by the formula AO—$(CH_2)_r$—, wherein A is a group selected from the group consisting of an acetyl group, a propionyl group, a benzoyl group, a trimethylsilyl group, a triethylsilyl group, a tert-butyldimethylsilyl group, a t-butyldiphenylsilyl group, a methoxymethyl group, a methoxyethoxymethyl group, a 1-ethoxyethyl group, a tetrahydropyran-2-yl group, a tetrahydrofuran-2-yl group, a tert-butoxycarbonyl group, a methyl group, an ethyl group, a t-butyl group, an octyl group, a benzyl group, a p-methoxybenzyl group, a fluorenyl group, a trityl group, and a benzhydryl group, and r is an integer of 1 to 10, $R^2$ represents a phenyl group that may be substituted with an alkyl group, a halogen atom or an alkoxy group, or an alkyl group having 1 to 20 carbon atoms, and l, m, and n individually represent 0 or an arbitrary integer, provided that l and n are not 0 at the same time.

9. The molding material according to claim 1, wherein the polysilsesquioxane compound is in an amount of 80 wt % or more of the total amount of the molding material that has a ladder structure having, a repeating unit shown by the formula (I).

10. The molding material according to claim 1, wherein the polysilsesquioxane compound is in an amount of 90 wt % or more of the total amount of the molding material that has a ladder structure having a repeating unit shown by the formula (I).

11. A molding material consisting of (1) a polysilsesquioxane compound with a ladder structure having a repeating unit shown by the formula (I), and (2) optionally an antioxidant, a UV absorber, a photostabilizer, a diluent or a silane coupling agent:

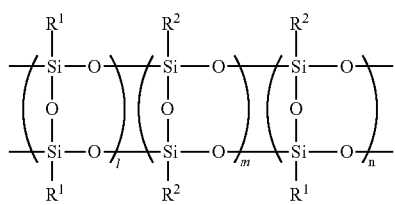

(I)

wherein $R^1$ represents a group shown by the formula AO—$(CH_2)_r$—, wherein A is a group selected from the group consisting of an acetyl group, a propionyl group, a benzoyl group, a trimethylsilyl group, a triethylsilyl group, a tert-butyldimethylsilyl group, a t-butyldiphenylsilyl group, a methoxymethyl group, a methoxyethoxymethyl group, a 1-ethoxyethyl group, a tetrahydropyran-2-yl group, a tetrahydrofuran-2-yl group, a tert-butoxycarbonyl group, a t-butyl group, an octyl group, a benzyl group, a p-methoxybenzyl group, a fluorenyl group, a trityl group, and a benzhydryl group, and r is an integer of 1 to 10, $R^2$ represents a phenyl group that may be substituted with an alkyl group, a halogen atom or an alkoxy group or alkyl group having 1 to 20 carbon atoms, and l, m, and n individually represent 0 or an arbitrary integer, provided that l and n are not 0 at the same time.

* * * * *